(12) United States Patent
Pandey et al.

(10) Patent No.: US 7,669,165 B2
(45) Date of Patent: Feb. 23, 2010

(54) METHOD AND SYSTEM FOR EQUIVALENCE CHECKING OF A LOW POWER DESIGN

(75) Inventors: Manish Pandey, San Jose, CA (US);
Rajat Arora, Sunnyvale, CA (US);
Chih-Chang Lin, Saratoga, CA (US);
Huan-Chih Tsai, Saratoga, CA (US);
Bharat Chandramouli, San Jose, CA (US); Kei-Yong Khoo, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 96 days.

(21) Appl. No.: 11/586,879

(22) Filed: Oct. 25, 2006

(65) Prior Publication Data

US 2008/0127014 A1    May 29, 2008

(51) Int. Cl.
*G06F 17/50* (2006.01)
(52) U.S. Cl. ............................................. 716/18; 716/3
(58) Field of Classification Search ................ 716/1–18
See application file for complete search history.

(56) References Cited

U.S. PATENT DOCUMENTS

| | | | |
|---|---|---|---|
| 6,600,358 B1* | 7/2003 | Chan | 327/333 |
| 6,779,163 B2 | 8/2004 | Bednar et al. | |
| 6,820,240 B2 | 11/2004 | Bednar et al. | |
| 6,883,152 B2 | 4/2005 | Bednar et al. | |
| 2007/0083839 A1* | 4/2007 | Lahner et al. | 716/11 |

OTHER PUBLICATIONS

Zhong et al., Interconnect-aware High-level Synthesis for Low Power, IEEE/ACM International Conference on Computer Aided Design, Nov. 2002, pp. 110-117.*
Kanno et al., Hierarchical Power Distribution with 20 Power Domains in 90-nm Low-Power Multi-CPU Processor, 2006 IEEE International Conference on Solid-State Circuits Digest of Technical Papers, Feb. 2006, pp. 2200-2209.*
Viswanath et al., "Automatic Insertion of Low Power Annotations in RTL for Pipelined Microprocessors", Proceedings of Design, Automation, and Test in Europe 2006, vol. 1, pp. 1-6, Mar. 2006.*

* cited by examiner

*Primary Examiner*—Vuthe Siek
*Assistant Examiner*—Aric Lin
(74) *Attorney, Agent, or Firm*—Duane Morris LLP

(57) ABSTRACT

Method and system for equivalence checking of a low power design are disclosed. The method includes receiving a register-transfer level (RTL) netlist representation of a circuit, receiving a power specification file for describing power requirements of the circuit, creating a low power gate netlist for representing a design implementation of the circuit using the RTL netlist and the power specification file, creating a reference low power RTL netlist for representing a design specification of the circuit using the RTL netlist and the power specification file, and performing equivalence checking between the low power gate netlist and the reference low power RTL netlist. The method further includes annotating low power information described in the power specification file into the reference low power RTL netlist, and creating low power logic in the reference low power RTL netlist.

20 Claims, 8 Drawing Sheets

METHOD AND SYSTEM FOR EQUIVALENCE CHECKING OF A LOW POWER DESIGN

FIELD OF THE INVENTION

The present invention relates to the field of electronic design automation tools. In particular, the present invention relates to a method and system for equivalence checking for low power designs.

BACKGROUND OF THE INVENTION

Due to consumers' increasing expectation of longer battery life and higher performance for their mobile devices, power management has become one of the most critical design issues. However, as integrated circuits move into nanometer-scale processes, devices created using 90-nanometer and smaller process technologies can consume as much power when they are not in use as when they are being used because of increased leakage current when the devices are in the idle state. Minimizing leakage current and optimizing dynamic power consumption can lead to longer battery life and lower packaging and cooling costs. While advanced low power design methodologies, such as static and dynamic voltage/frequency scaling, power gating, and state retention, offer additional power savings, they also increase the complexity of design verification.

The complexity of design verification is exacerbated by the fact that the majority of the low power logic is introduced into the gate netlist during synthesis and physical implementation. However, a full-chip exhaustive gate-level simulation is not a practical or scalable methodology for verifying the functionalities of today's complex designs. In recent years, verification methodology utilizing formal (mathematical) proofs has gained wide popularity due to their ability to verify complex designs exhaustively. Equivalence checking (EC) is one such formal verification method which allows checking the logical equivalence of two designs at the same or different-levels of abstraction. For instance, EC can check whether an implemented full-chip gate netlist is equivalent to the reference full-chip RTL design.

FIG. 1A illustrates a conventional method for conducting equivalence checking. As shown in FIG. 1A, the method compares a design specification represented by an RTL netlist 102 to a design implementation represented by a gate netlist 106. The gate netlist 106 is created from the RTL netlist 102 by using a synthesis tool 104. In general, an EC methodology utilizes formal verification techniques such as Binary Decision Diagrams (BDDs) and Satisfiability (SAT) Solvers that operate on the Boolean gate level netlist to establish the equivalence between the RTL netlist 102 and the gate netlist 106 of a design. One drawback of this conventional methodology is that no low power logic is included in the RTL netlist and the gate netlist, and thus the EC does not verify any low power logic that may be used in the ultimate design.

FIG. 1B illustrates another conventional method for conducting equivalence checking. This method modifies the conventional method described in FIG. 1A by incorporating synthesis-tool specific low power commands 103 in the generation of the gate netlist. Thus the synthesis tool 104 uses both the RTL netlist and the synthesis-specific low power commands to generate a low power gate netlist 108. Then, the EC is conducted between the design specification represented by the RTL netlist 102 and the design implementation represented by the low power gate netlist 108. There are at least two drawbacks associated with this approach. First, the low power logic in the gate netlist cannot be verified since there is no low power logic in the original RTL netlist. Second, performing EC between RTL netlist and low power gate netlist without disabling the low power logic in gate netlist may yield incorrect verification results. The reason is that the low power logic inserted in the gate netlist by the synthesis-specific commands, such as isolation cell logic, state retention cell logic etc., is shared with the normal operation logic, and can alter the functionality of the design in the normal operating modes. In order to perform EC of normal operating mode (between RTL netlist and low power gate netlist), certain constraints need to be manually added to the low power gate netlist. These constraints tie certain signals in the design (pins or nets) to logic 0 or logic 1 value, thereby allowing disabling the low power logic. The process of applying such hard-coded (0 or 1) constraints to the gate netlist is very tedious and prone to human errors. Furthermore, applying multiple pin or net constraints on the low power gate netlist may cause certain valid functional modes to be excluded from the formal verification process, thereby resulting in incomplete verification.

Therefore, there is a need to address the issues associated with the conventional equivalence checking methodologies for a low power design.

SUMMARY

The present invention relates to a method and system for equivalence checking of a low power design. In one embodiment, a method for conducting equivalence checking of an integrated circuit includes receiving a register-transfer level (RTL) netlist representation of a circuit, receiving a power specification file for describing power related information for the design, creating a low power gate netlist for representing a design implementation of the circuit using the RTL netlist and the power specification file, creating a reference low power RTL netlist for representing a design specification of the circuit using the RTL netlist and the power specification file, and performing equivalence checking between the low power gate netlist and the reference low power RTL netlist.

BRIEF DESCRIPTION OF THE DRAWINGS

The aforementioned features and advantages of the invention, as well as additional features and advantages thereof, will be more clearly understandable after reading detailed descriptions of embodiments of the invention in conjunction with the following drawings.

Like numbers are used throughout the figures.

DESCRIPTION OF EMBODIMENTS

Figure 1A:
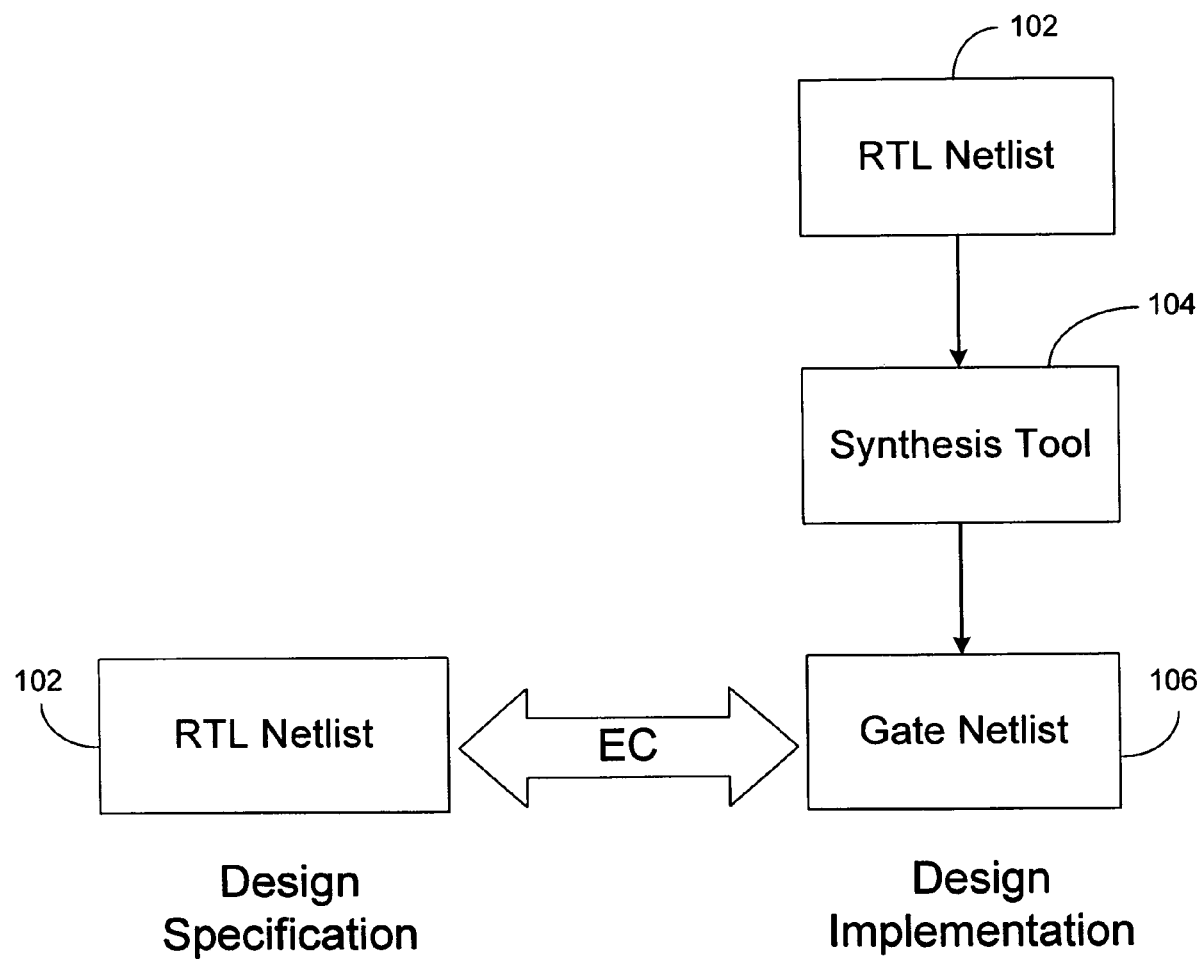
FIG. 1A illustrates a conventional method for conducting equivalence checking.
Figure 1B:
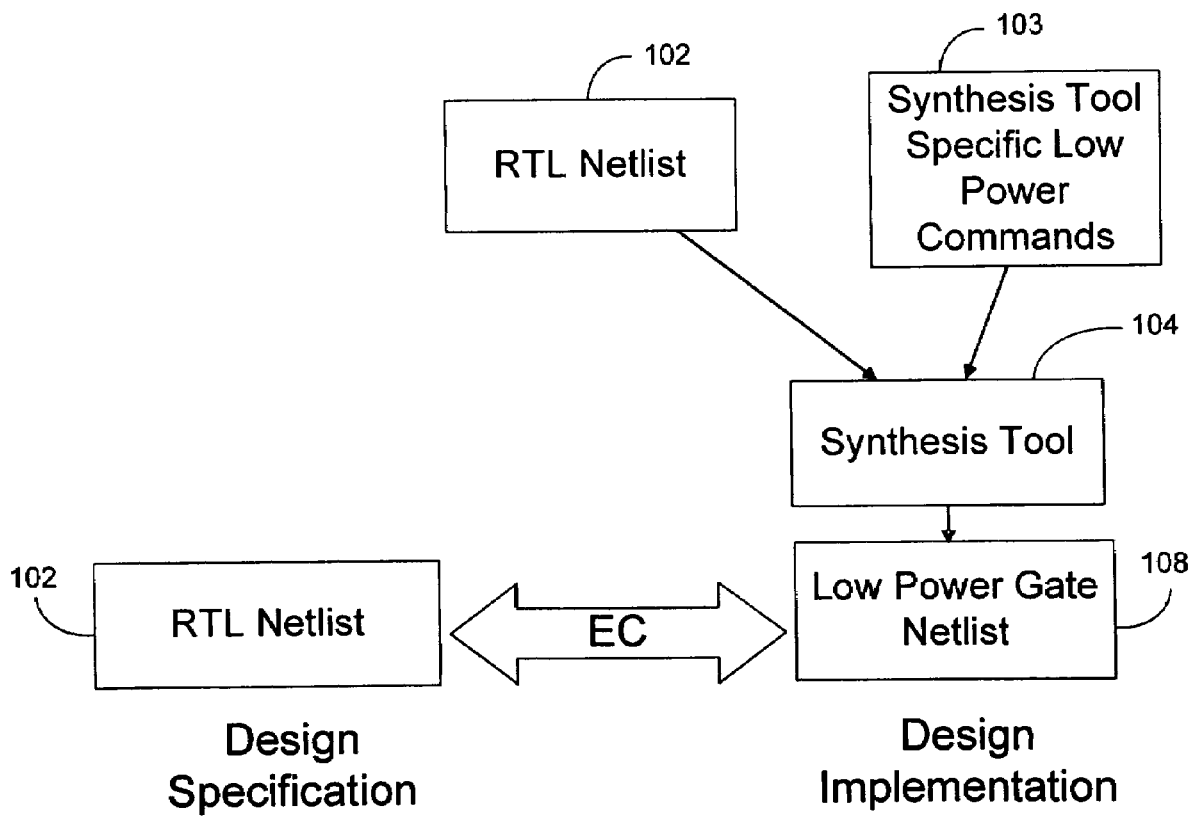
FIG. 1B illustrates another conventional method for conducting equivalence checking.

Methods and systems are provided for equivalence checking of a low power design. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Some portions of the detailed description that follows are presented in terms of flowcharts, logic blocks, and other symbolic representations of operations on information that can be performed on a computer system. A procedure, computer-executed step, logic block, process, etc., is here conceived to be a self-consistent sequence of one or more steps or instructions leading to a desired result. The steps are those utilizing physical manipulations of physical quantities. These quantities can take the form of electrical, magnetic, or radio signals capable of being stored, transferred, combined, compared, and otherwise manipulated in a computer system. These signals may be referred to at times as bits, values, elements, symbols, characters, terms, numbers, or the like. Each step may be performed by hardware, software, firmware, or combinations thereof.

A power specification file contains design and technology-related power constraints that capture a designer's power management intent. In general, a power specification file allows a designer to specify the power domains, low power cells, rules for creating low power logic, etc. A power specification file is defined in any low power design specification language. The Common Power Format (CPF) is a low power design specification language created by Cadence Design Systems, Inc., and is used for creating a power specification file. In subsequent text, references to CPF file will mean references to a power specification file created in any generic low power design specification language. Similarly, a CPF command will refer to any generic low power design specification command.

In a low power design, a power domain (PD) is a collection of logic blocks (hierarchical instances) and leaf instances that use the same power supply during normal operation and that can be powered on or off at the same time. In addition, a power mode (PM) is a static state of a design that indicates the ON and OFF status of each power domain; a power management module (PMM), which is also called as the power manager, is a low power controller that generates control signals for enabling or disabling the low power logic; isolation (ISO) cells are logic used to isolate signals which are going from a power off domain to a power on domain; level shifter (LS) cells are logic to pass data signals between power domains operating at different voltages; and state retention (SR) cells are special flop or latch used to retain the state of the cell when its main power supply is turned off.

Figure 2:
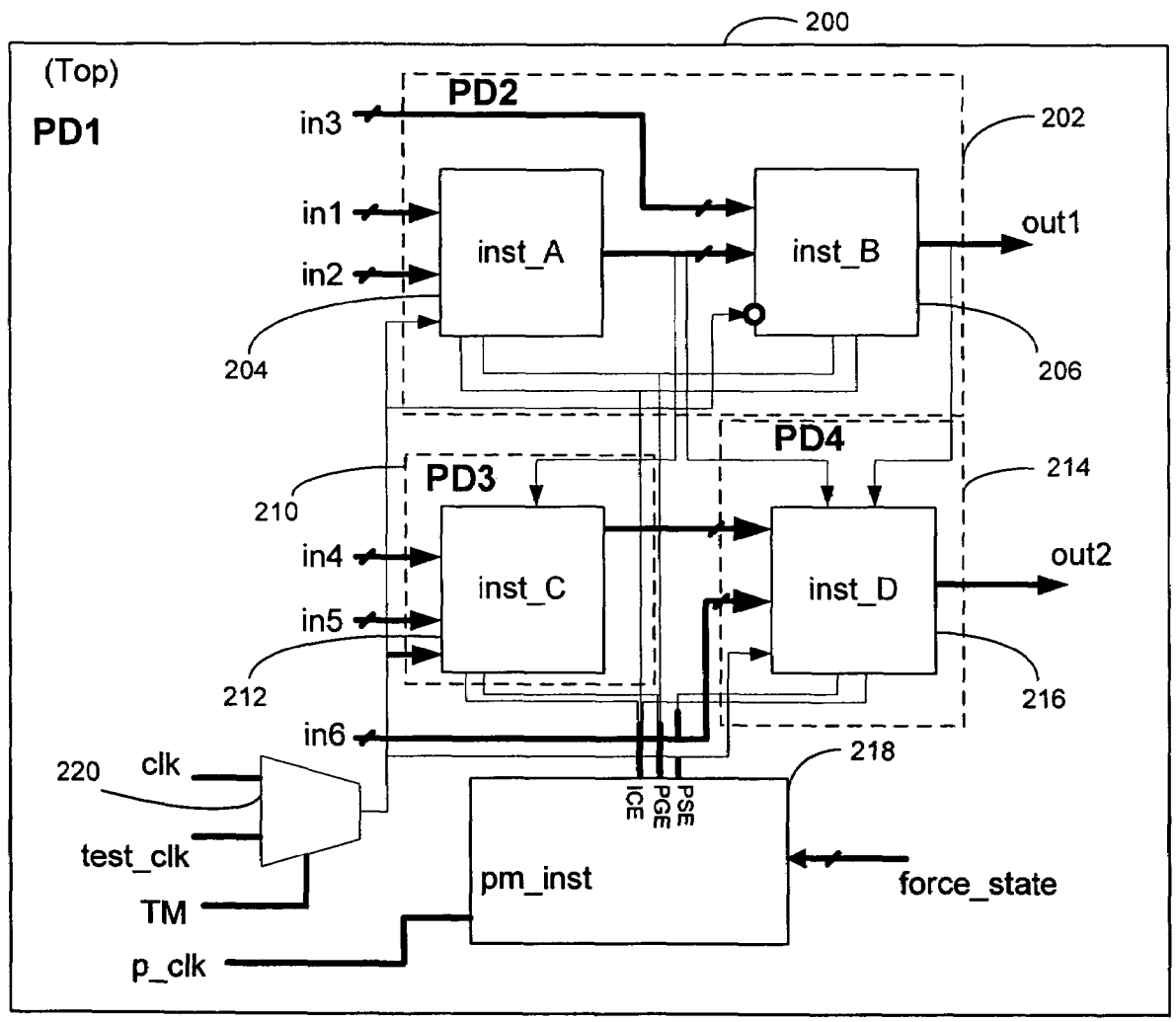
FIG. 2 illustrates an example design incorporating power information according to an embodiment of the present invention.

FIG. 2 illustrates an example design incorporating power information according to an embodiment of the present invention. The example design 200 includes four logic instances inst_A 204, inst_B 206, inst_C 212, and inst_D 216, a power manager instance pm_inst 218, and a clock muxing logic 220. Each design instance includes a set of input and output signals. The clock muxing logic 220 receives inputs clk and test_clk, and a control signal TM. Based on the control signal TM, the clock muxing logic selects clk or test_clk as its output, which is then fed to instances inst_A 204, inst_B 206, inst_C 212, and inst_D 216.

As shown in FIG. 2, the example design includes four power domains. The top-level design (also referred to as top design) and the power manager instance pm_inst 218 belong to the default power domain PD1 200. Instances inst_A 204 and inst_B 206 belong to the power domain PD2 202. Instance inst_C 212 belongs to power domain PD3 210. Instance inst_D 216 belongs to power domain PD4 214. Table 1 shows the static behavior of the four domains according to embodiments of the present invention.

TABLE 1

| Power Domain | Power Mode | | | |
| --- | --- | --- | --- | --- |
| | PM1 | PM2 | PM3 | PM4 |
| PD1 | ON | ON | ON | ON |
| PD2 | ON | OFF | OFF | OFF |
| PD3 | ON | ON | OFF | OFF |
| PD4 | ON | ON | ON | OFF |

The power manager instance (pm_inst) 218 generates three sets of control signals, namely pse_enable, pge_enable, and ice_enable, to control each power domain. Table 2 shows control signals of the power manager instance pm_inst 218 for controlling the four power domains according to embodiments of the present invention.

TABLE 2

| Power Domain | Power Control Signals | | |
| --- | --- | --- | --- |
| | power switch enable (PSE) | isolation cell enable (ICE) | power gating enable (PGE) |
| PD1 | no control signal | no control signal | no control signal |
| PD2 | pse_enable[0] | ice_enable[0] | pge_enable[0] |
| PD3 | pse_enable[1] | ice_enable[1] | pge_enable[1] |
| PD4 | pse_enable[2] | ice_enable[2] | pge_enable[2] |

The following is an example netlist of a common power format (CPF) file of the top design according to an embodiment of the present invention.

```
# Define top design
set_top_design top
# Set up logic structure for all power domains
create_power_domain -name PD1 -default
create_power_domain -name PD2 -instances {inst_A inst_B} \
-shutoff_condition {pm_inst.pse_enable[0]}
create_power_domain -name PD3 -instances inst_C \
-shutoff_condition {pm_inst.pse_enable[1]}
create_power_domain -name PD4 -instances inst_D \
-shutoff_condition {pm_inst.pse_enable[2]}
# Define static behavior of all power domains and specify timing constraints
create_power_mode -name PM1 -sdc_files ../SCRIPTS/cm1.sdc \
-activity_file ../SIM/top_1.tcf
create_power_mode -name PM2 -off_domains PD2 -sdc_files ../SCRIPTS/cm2.sdc
create_power_mode -name PM3 -off_domains {PD2 PD3}
create_power_mode -name PM4 -off_domains {PD2 PD3 PD4}
# Set up required isolation and state retention logic of all domains
create_state_retention_logic -restore_edge {pm_inst.pge_enable[0]} \
-instances inst_A.reg_bank_1.out
create_state_retention_logic -power_domain PD3 -restore_edge \
{pm_inst.pge_enable[1]}
create_state_retention_logic -power_domain PD4 -restore_edge \
{pm_inst.pge_enable[2]}
create_isolation_logic -from PD2 -isolation_condition \
{pm_inst.ice_enable[0]} -isolation_output high
create_isolation_logic -from PD3 -isolation_condition \
{pm_inst.ice_enable[1]}
create_isolation_logic -from PD4 -isolation_condition \
{pm_inst.ice_enable[2]}
```

In a normal design process, a low power design undergoes numerous iterations prior to final layout, and each step in this process has the potential to introduce logical errors. The methodology presented by the current invention can be employed to check functional equivalence of different versions of a low power design at these various stages and enables designers to identify and correct errors as soon as they are introduced.

In addition, the method validates the insertion of state retention registers in the design netlist using user-defined mapping rules. These mapping rules are validated during an equivalence checking run. The method also models level shifters and isolation cells as domain anchor points (compare points) during equivalence checking to detect whether logic gates have erroneously crossed domain boundaries from one version of the netlist to another.

Figure 3:
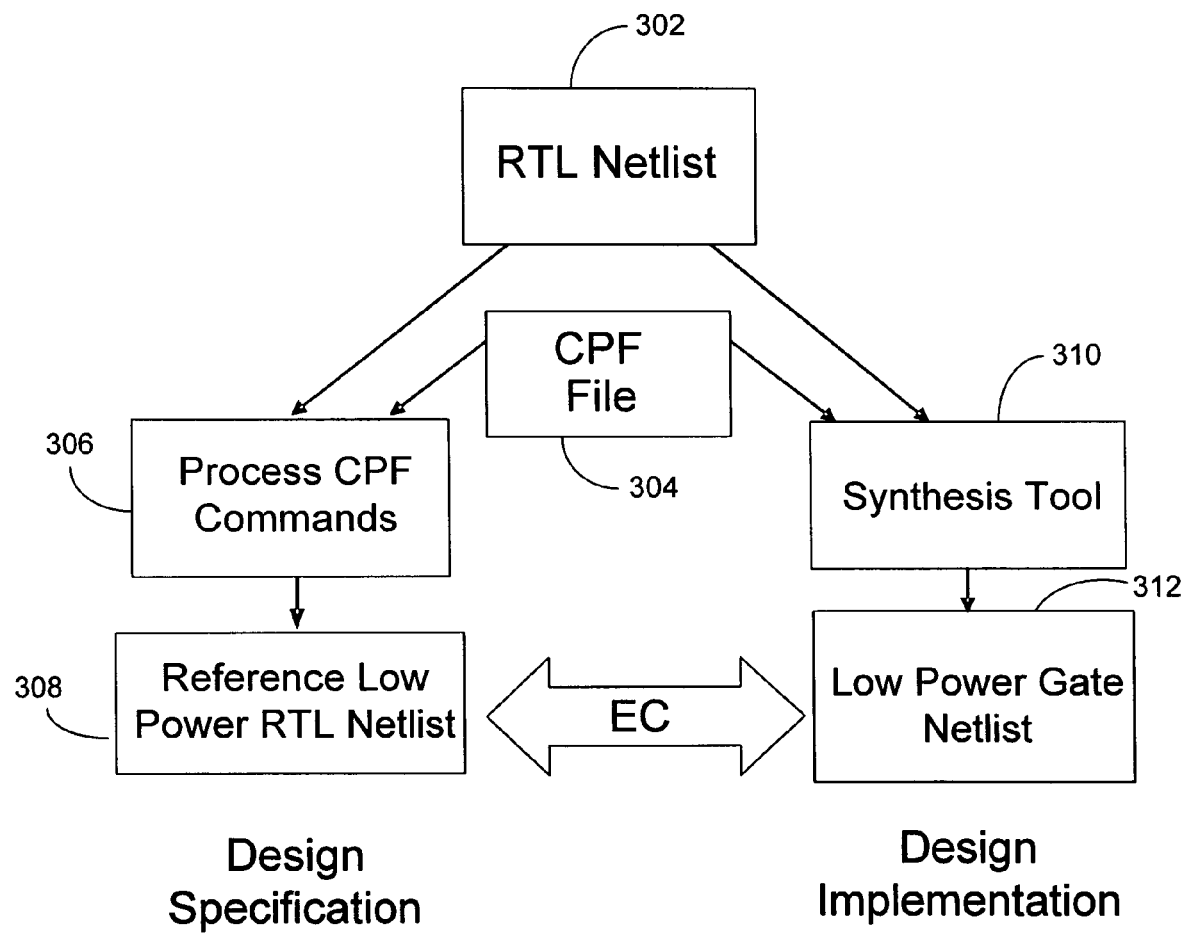
FIG. 3 illustrates a method for conducting equivalence checking according to an embodiment of the present invention.

FIG. 3 illustrates a method for conducting equivalence checking according to an embodiment of the present invention. In this example, the original RTL netlist 302 and a CPF file 304 are used to generate a reference low power RTL netlist 308 representing the design specification and a low power gate netlist 312 representing design implementation for equivalence checking. In this approach, first, the original RTL netlist 302 and a CPF file 304 are processed (in block 306) to generate a reference low power RTL netlist 308, which represents the design specification. The original RTL netlist 302 and the CPF file 304 are processed by a synthesis tool 310 to generate a low power gate netlist 312, which represents the design implementation. Then, EC is conducted between the low power RTL netlist 308 and the low power gate netlist 312 for design verification.

In one embodiment, the method and system for equivalence checking of a low power design may be implemented using a computer system. The computer system may include one or more central processing units (CPUs), at least a user interface for displaying computation results and circuit schematics, a memory device, a system bus, and one or more bus interfaces for connecting the CPU, user interface, memory device, and system bus together. The computer system also includes at least one network interface for communicating with other devices on a computer network. In alternative embodiments, much of the functionality of the method and system for equivalence checking of a low power design may be implemented in one or more application-specific integrated circuits (ASICs) or field-programmable gate arrays (FPGAs), thereby either eliminating the need for a CPU, or reducing the role of the CPU.

The memory device may include high-speed random-access memory and may also include non-volatile memory, such as one or more magnetic disk storage devices. The memory device may also include mass storage that is remotely located from the CPU(s). The memory device preferably stores:
- an operating system that includes procedures for handling various basic system services and for performing hardware-dependent tasks;
- databases for storing information of the circuit;
- application programs for performing other user-defined applications and tasks; and
- an integrated sizing, layout, and extractor program for designing the circuit.

The database, the application programs, and the integrated sizing, layout, and extractor program may include executable procedures, sub-modules, tables, and other data structures. In other embodiments, additional or different modules and data structures may be used, and some of the modules and/or data structures listed above may not be used.

The CPF file may be used throughout the design automation tool flow, such as verification, synthesis, test, physical synthesis, routing, etc. Examples of commercial tools that support the CPF file include Conformal, RTL Compiler, SoC Encounter, Encounter Test, and NCSim Simulator from Cadence Design Systems, Inc.

Figure 4:
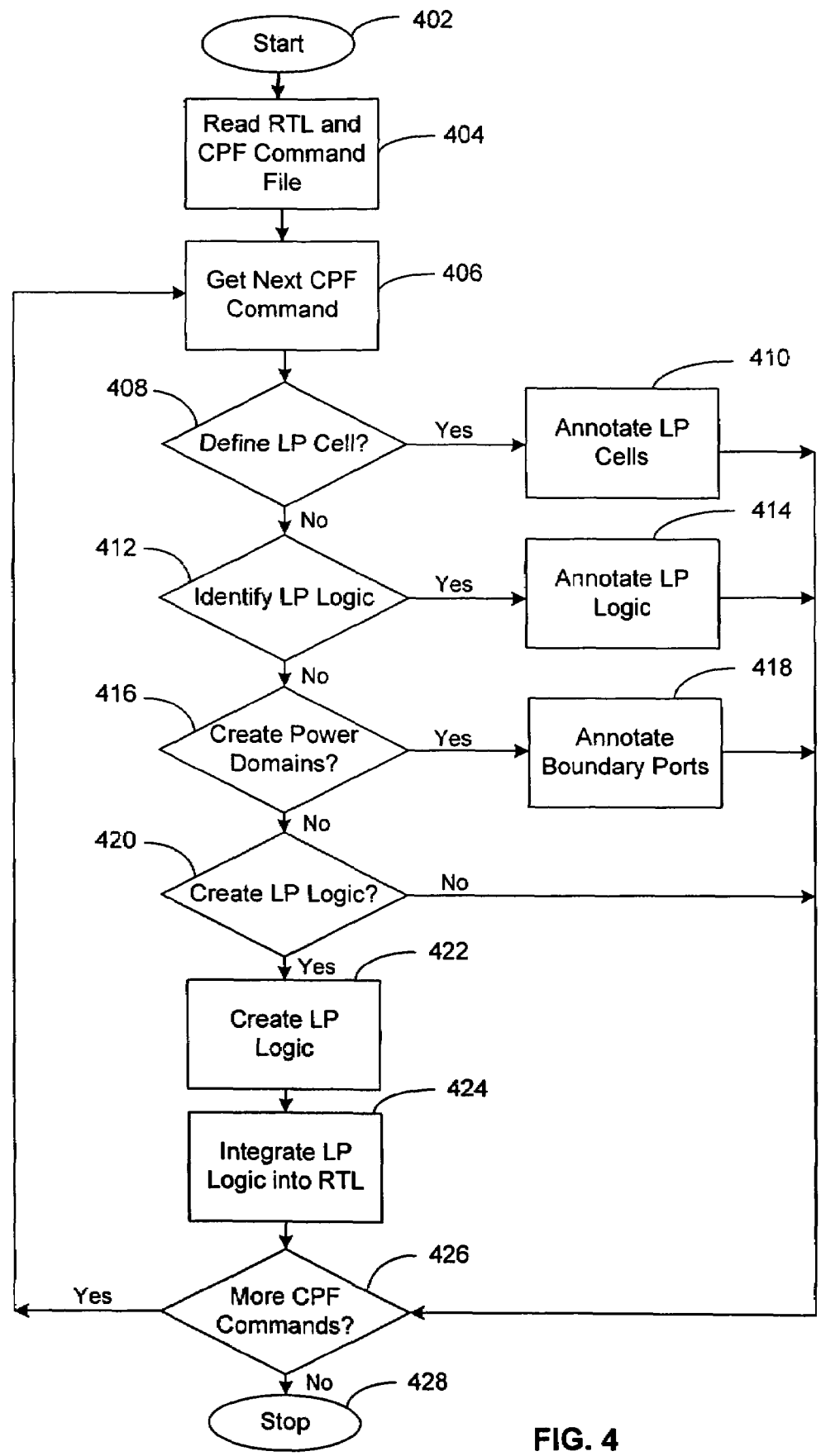
FIG. 4 illustrates a flow diagram for processing power specification file commands to generate a reference low power RTL netlist according to an embodiment of the present invention.

FIG. 4 illustrates a flow diagram for processing CPF commands to generate a reference low power RTL netlist according to an embodiment of the present invention. In this exemplary flow diagram, the method starts in block 402 and thereinafter moves to block 404 where the method reads the RTL netlist and the CPF command file. In block 406, the method gets the next command in the CPF file and processes the CPF command which may annotate the low power information or create the low power logic in RTL design.

In block 408, a first determination is made as to whether the CPF command is a define-low-power-cells command. If the CPF command is not a define-low-power-cells command (408_No), the method moves to block 412. In the alternative, if the CPF command is a define-low-power-cells command, the method continues in block 410 where the method annotates the low power cells in RTL netlist or library. After completing annotating low power cells in block 410, the method continues in block 426. Examples of CPF commands that define low power cells are define_isolation_cell, define_level_shifter_cell, define_state_retention_cell, etc.

The define_isolation_cell command identifies the library cells that can be used as isolation cells. It also allows the method to identify the instances of isolation cells in RTL where library files are not used. An exemplary syntax of the define_isolation_cell command is shown below.

```
define_isolation_cell
-cells cell_list [-libraries library_list]
[{-power_switchable LEF_power_pin | -ground_switchable
LEF_ground_pin}
-power LEF_power_pin -ground LEF_ground_pin]
[-valid_location { from | to}]   -enable pin
```

The define_level_shifter_cell command identifies the library cells that can be used as level shifter cells. It also allows the method to identify the instances of level shifter cells in RTL where library files are not used. An exemplary syntax of the define_level_shifter_cell command is shown below.

```
define_level_shifter_cell
-cells cell_list [-libraries library_list]
-input_voltage_range {voltage | voltage_range}
-output_voltage_range {voltage | voltage_range}
[-direction {up|down|bidiri}] [-output_voltage_input_pin pin]
{ -input_power_pin LEF_power_pin [-output_power_pin
LEF_power_pin]
| [-input_power_pin LEF_power_pin] -output_power_pin
LEF_power_pin }
-ground LEF_ground_pin
[-valid_location { from | to}]
```

The define_state_retention_cell command identifies the library cells that can be used as state retention cells. In addition, it allows the method to identify the instances of state retention cells in RTL where library files are not used. An exemplary syntax of the define_state_retention_cell command is shown below.

```
define_state_retention_cell
    -cells cell_list [-libraries library_list]
    [-clock_pin pin]
    -restore_function expression [-restore_check expression]
    [-save_function expression] [-save_check expression]
    [ {-power_switchable LEF_power pin | -ground_switchable
    LEF_ground_pin}
    -power LEF_power_pin -ground LEF_ground_pin ]
```

In block 412, a second determination is made as to whether the CPF command is an identify_power_logic command. If the CPF command is not an identify_power_logic command (412_No), the method moves to block 416. In the alternative, if the CPF command is an identify_power_logic command (412_Yes), the method continues in block 414 where the method annotates the low power logic in RTL netlist. After completing annotating low power logic in block 414, the method continues in block 426. The identify_power_logic command indentities any isolation logic instantiated in RTL that is implemented through regular cells (non-library cells), and is not defined through the define_isolation_cell command. An exemplary syntax of the identify_power_logic command is shown below.

```
identify_power_logic
    -type isolation
    -instances instance_list
```

In block 416, a third determination is made as to whether the CPF command is a create_power_domain command. If the CPF command is not a create_power_domain command (416_No), the method moves to block 420. In the alternative, if the CPF command is a create_power_domain command (416_Yes), the method continues in block 418 where the method annotates the boundary ports of the low power domains. After completing annotating boundary ports in block 418, the method continues in block 426. The create_power_domain command creates a power domain and specifies the instances and top-level ports that belong to this power domain. By default, instance inherits the power domain setting from its parent hierarchical instance or design. An exemplary syntax of the create_power_domain command is shown below.

```
create_power_domain
    -name power_domain
    { -default [-instances instance_list]
    | -instances instance_list [-boundary_ports pin_list]
    | -boundary_ports pin_list }
    [ -power_switchable_nets net_list | -ground_switchable_nets net_list]
    [ -shutoff_condition expression]
```

In block 420, a fourth determination is made as to whether the CPF command is a create-low-power-logic command. If the CPF command is not a create-low-power-logic command (420_No), the method continues in block 426. In the alternative, if the CPF command is a create-low-power-logic command (420_Yes), the method moves to block 422 where the method uses the annotated low power information to synthesize low-power logic into the RTL netlist. Examples of CPF commands that create low power logic include create_level_shifter_logic, create_isolation_logic, and create_state_retention_logic.

In one example, the syntax of the create_level_shifter_logic command and the pseudo code for processing this command is listed below.

```
create_level_shifter_logic
    { -from power_domain | -to power_domain_list}
    [-location {from | to} ]
    [-cells cell_list] [-prefix string]
```

1) If -from/-to option is specified,
    identify all the power crossing net pairs ("from" net and "to" net) that go from/to the specified Power Domain (PD) to/from any other PD
2) Analyze the net pairs to determine insertion location(s) for Level Shifter (LS) cells
    LS cells are inserted at "from" net (output net of module) or at "to" net (input net of a module) depending on the voltage level required by the driven nets. The algorithm can be controlled to insert minimal number of LS cells between two power domains.
3) Use LS cells from cell_list or pre-defined LS cells
4) Insert the LS cells In another example, the syntax of the create_isolation_logic and the pseudo code for processing this command is shown below.

```
create_isolation_logic
    -isolation_condition expression
    {-pins pin_list | -from power_domain_list | -to power_domain_list} ...
    [-exclude pin_list] [-location {from | to} ] [-isolation_output
    {high|low|hold}]
    [-cells cell_list] [-prefix string]
```

1) If -from/-to option is specified,
    identify all the power crossing net pairs ("from" net and "to" net) which go from/to the specified Power Domains (PDs) to/from any other PD
2) If -pins option is specified, identify all the power crossing net pairs such that the
    first net in each pair originates from the pin_list
    second net in each pair starts a new PD boundary
3) Use expression to generate the logic for isolation condition which controls the output of the isolation cell, and integrate the isolation condition logic with the isolation cell and the power manager;
    4) Analyze the net pairs to determine insertion location(s) for Isolation (ISO) cells
    ISO cells are inserted at "from" net (output net of module) or at "to" net (input net of a module) depending on the logic value required at the driven nets. The algorithm can be controlled to insert minimal number of ISO cells between two power domains
5) Use Isolation Cells (ISO) from cell_list or pre-defined ISO cells
    selection of isolation cells will depend on value of isolation_output and isolation_condition
6) Insert the ISO cells In yet another example, the syntax of the create_state_retention_logic and the pseudo code for processing this command is shown below.

```
create_state_retention_logic
    { -power_domain power_domain | -instances instance_list }
    -restore_edge expression [ -save_edge expression ]
```

-continued

[ -clock_gating_condition expression ]
[ -cell_type string ]

1) Identify all data storage element instances, such as D flip-flops (DFFs)/D latches (DLATs), in a specified power domain
2) Replace the normal DFFs/DLATs with state retention cells
3) Generate control logic for restore_edge/save_edge and stitch this control logic between state retention cell and power manager
4) Generate the control logic for clock_gating_condition and stitch this control logic between state retention cell and power manager In block 424, the method integrates the low power logic created in block 422 into the RTL netlist. In block 426, a fifth determination is made as to whether there are more commands in the CPF file to be processed. If there are more commands in the CPF file to be processed (426_Yes), the method continues in block 406 and repeats the processing blocks between 406 and 424. In the alternative, if there are no more commands in the CPF file to be processed (426_No), the method goes to block 428 and ends the processing of the CPF commands. In another embodiment, the blocks 422 and 424 can be processed after the block 426. Such an embodiment will involve processing all the commands specified in the CPF file before creating the low power logic, and integrating the created low power logic into the RTL netlist to generate the reference low power RTL netlist.

Figure 5A:
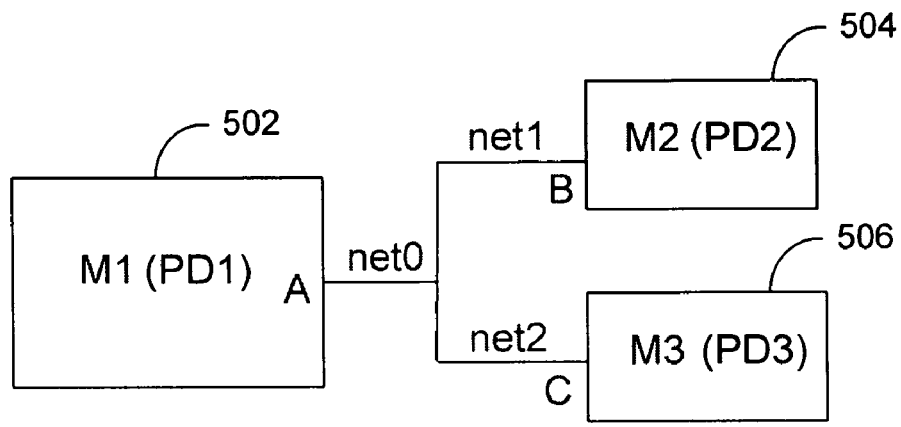
FIGS. 5A-5E illustrate insertion of low power logic in an exemplary design according to embodiments of the present invention.

FIGS. 5A-5E illustrate insertion of low power logic in an exemplary design according to embodiments of the present invention. In FIG. 5A, the exemplary design includes an instance of module M1 502 residing in power domain 1 (PD1), an instance of module M2 504 residing in power domain 2 (PD2), and an instance of module M3 506 residing in power domain (PD3). In this example, pin A of M1 502 fans out to pin B of module instance M2 504 of power domain PD2 and to pin C of module instance M3 of power domain PD3 506, respectively. The output net of M1 (PD1) is net0, the input net of M2 (PD2) is net1, and the input net of M3 (PD3) is net 2.

Referring to the example shown in FIG. 5A, the pseudo code for inserting the level shifter logic using the CPF command create_level_shifter_logic -from PD1 -location from is as follows. The design after insertion of level shifter logic is shown in FIG. 5B.
1) Since -from option is specified, get the appropriate power domain crossing net pairs, i.e., (net0, net1) and (net0, net2)
2) Analyze the power domain crossing net pairs to determine insertion location(s) for level shifters
LS cell cannot be inserted at net0, because it fans out to two different PDs
LS cells can be inserted at net1 and net2
3) Use LS cells from pre-defined LS cells, since -cell option is not specified
4) Insert LS cells at net1 and net2

Figure 5B:
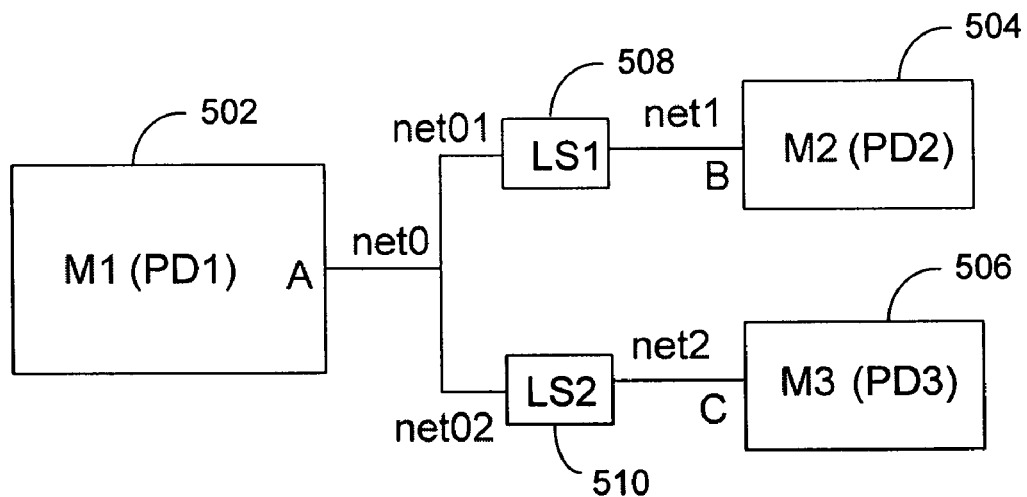
Figure 5B:
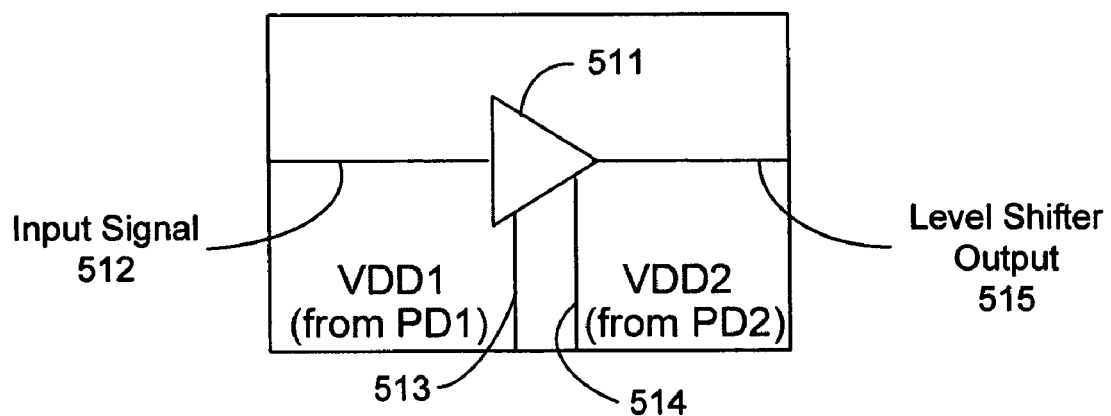

As shown in FIG. 5B, a first level shifter cell LS1 508 is inserted between M1 (PD1) 502 and M2 (PD2) 504, and a second level shifter cell LS2 510 is inserted between M1 (PD1) 502 and M3 (PD3) 506. These level shifter cells are necessary to shift the voltage levels of signals going from one power domain (PD1) to a different power domain (PD2 or PD3).

In this example, a level shifter cell includes a buffer 511, an input signal line 512, a first power supply signal line (VDD1) 513 from power domain 1, a second power supply signal line (VDD2) 514 from power domain 2, and a level shifter output signal line 515. After inserting the level shifter cells, the functionality of the design in low power mode is same as in normal operation mode.

Since pin A of M1 (PD1) and pin B of M2 (PD2) belong to different power domains, the tool inserts the first level shifter cell at net1. Similarly, since pin A of M1 (P1) and pin C of M3 (PD3) belong to different power domains, the tool inserts the second level shifter cell at net2. Note that level shifter cells cannot be inserted at net0, because net0 fans out to two different power domains.

Figure 5C:
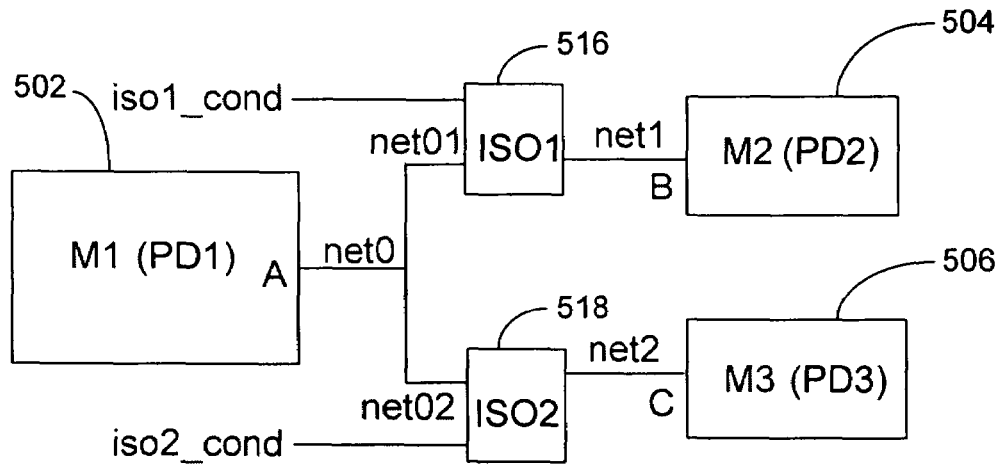
Figure 5C:
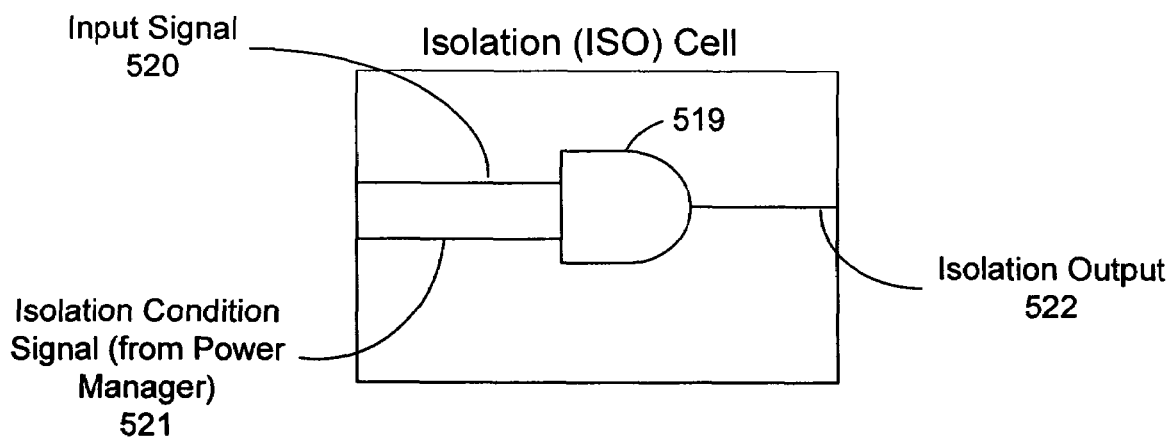

With respect to the example shown in FIG. 5A, the pseudo code for inserting the isolation logic using the CPF command create_isolation_logic—isolation_condition !(iso_en) -pin M1/A -location from -isolation_output low is as follows. The design after insertion of isolation logic is shown in FIG. 5C.
1) Since, -pin option is specified, get the appropriate power crossing net pairs, i.e., (net0, net1) and (net0, net2)
2) An inverter with iso_en as input (from power manager) is created to generate the signal isolation condition (iso_cond). The output (iso_cond) then feeds the isolation condition signal of the ISO cells.
3) Analyze the net pairs to determine insertion location(s) for ISO cell
ISO cell can be inserted at net1 and net2, or
ISO cell can be inserted at net0 (minimizes usage of ISO cells)
4) Use ISO cells from pre-defined ISO cells, since -cell option is not specified
5) Use an AND gate for ISO cell from pre-defined ISO cells, since isolation_output value is low (i.e. 0), and the isolation_condition value is 0 when iso_en is enabled (i.e., 1)
6) Insert ISO cell at net1 and net2 (ISO cell insertion is not minimized).

As shown in FIG. 5C, a first isolation cell ISO1 516 is inserted between M1 (PD1) and M2 (PD2), and a second isolation cell ISO2 518 is inserted between M1 (PD1) and M3 (PD3). For example, when PD2 is powered on and PD1 is switched off, the tool needs to insert isolation cell at net1 so that the logic value at net1 is 0. Similarly, when PD3 is powered on and PD1 is switched off, the tool needs to insert isolation cell at net2 so that the logic value at net2 is 0. In another implementation, the tool may insert a single isolation cell at net0, which may serve the same purpose as the two isolation cells shown in FIG. 5C, and thus minimizes the number of isolation cells used.

In this example, an isolation (ISO) cell includes an AND gate 519, an input signal 520, an isolation condition signal 521, and an isolation output 522. Note that iso1_cond and iso2_cond are signals representing the isolation condition for enabling isolation cells. The iso1_cond and iso2_cond are in turn driven by the iso_en signal from the power management module. In the above example iso1_cond and iso2_cond represent the same signal. In general, iso_cond is derived from the iso_en signal. In addition, after inserting the isolation cells, the functionality of the design in low power mode is different from normal operation mode.

Figure 5D:
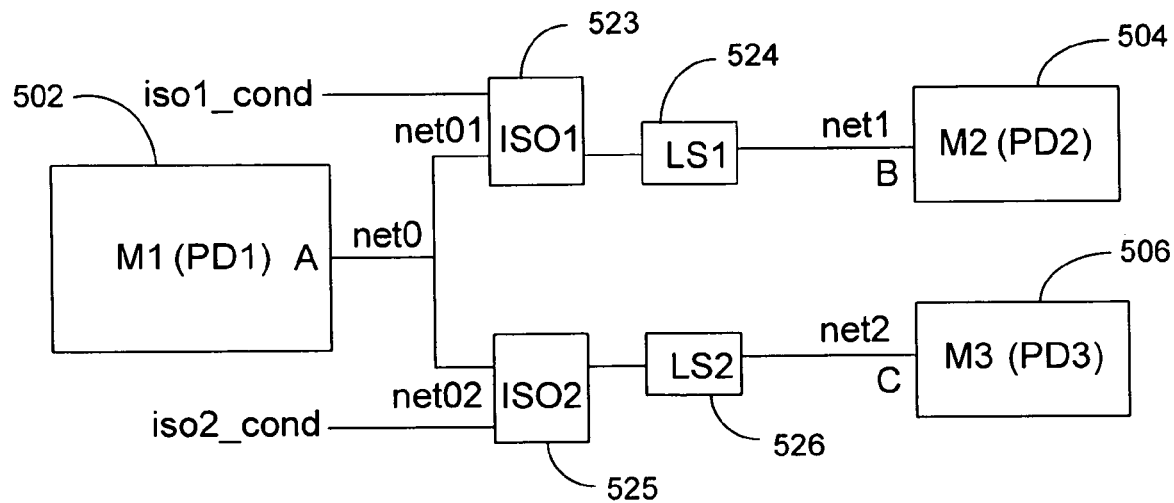

FIG. 5D illustrates another exemplary design of low power logic for equivalence checking according to embodiments of the present invention. In FIG. 5D, a first isolation cell ISO1 523 and a first level shifter cell LS1 524 are inserted between M1 (PD1) and M2 (PD2). A second isolation cell ISO2 525 and a second level shifter cell LS2 526 are inserted between M1 (PD1) and M3 (PD3).

Figure 5E:
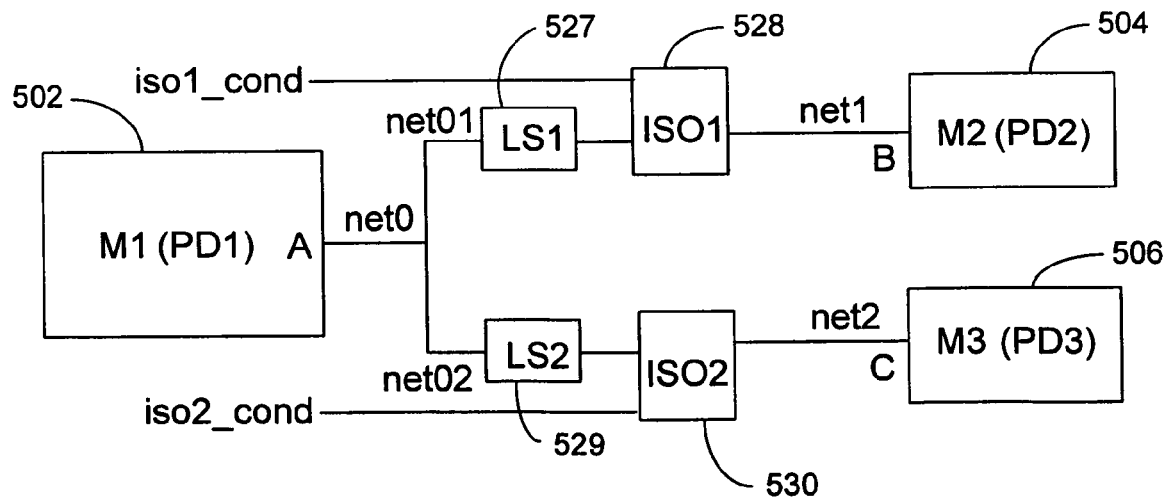

FIG. 5E shows a variation of the exemplary design of FIG. 5D. In FIG. 5E, the locations of the first level shifter cell LSI 527 and the first isolation cell ISO1 528 are switched as compared to FIG. 5D. Similarly, the locations of the second level shifter cell LS2 529 and the second isolation cell ISO2 530 are switched as compared to FIG. 5D.

There are a number of functionalities provided by the methodology of the present invention. First, the method enables EC of low power designs between a reference low power RTL netlist and a low power gate netlist. It is able to verify that the low power logic has been synthesized correctly by the synthesis tool in the RTL to gate synthesis. The method is employed to EC the entire chip functions, including normal functions and the low power functions. It provides an automatic EC flow without the need to manually apply constraints to the low power gate netlist.

The use of the CPF file provides a common source for realizing the low power logic in the reference low power RTL netlist and the low power gate netlist. In addition, the CPF file reinforces EC capabilities in verifying low power logic, such as checking one to one mapping of all isolation cells and level shifter cells between the reference RTL netlist and the lower power gate netlist, and checking for functional equivalence (normal function and low power function) for each power domain between the reference RTL netlist and the lower power gate netlist.

The benefits of the current invention include at least: 1) minimizing silicon re-spin risk by providing complete certification coverage; 2) detecting low power implementation errors early in the design cycle; 3) reducing verification time significantly by verifying multimillion gate designs faster than traditional gate-level simulation; and 4) closing the RTL-to-layout verification gap.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processors or controllers. Hence, references to specific functional units are to be seen as references to suitable means for providing the described functionality rather than indicative of a strict logical or physical structure or organization.

The invention can be implemented in any suitable form, including hardware, software, firmware, or any combination of these. The invention may optionally be implemented partly as computer software running on one or more data processors and/or digital signal processors. The elements and components of an embodiment of the invention may be physically, functionally, and logically implemented in any suitable way. Indeed, the functionality may be implemented in a single unit, in a plurality of units, or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as are suited to the particular use contemplated.

What is claimed is:

1. A method for conducting equivalence checking of a circuit, comprising:
   receiving a register-transfer level (RTL) netlist representation of a circuit;
   receiving a power specification file describing low power requirements of the circuit including,
   defining isolation cells,
   defining level shifter cells,
   defining state retention cells,
   identifying power logic, and
   creating power domains;
   creating using a method implemented on a computer system, a gate netlist using the RTL netlist and the power specification file, wherein the gate netlist represents a design implementation of the circuit;
   creating using a method implemented on the computer system, a reference low power RTL netlist using the RTL netlist and the power specification file, wherein the reference low power RTL netlist represents a design specification of the circuit;
   wherein creating a reference low power RTL netlist includes annotating the low power requirements described in the power specification file into the reference low power RTL netlist;
   wherein creating a reference low power RTL netlist further includes,
   creating isolation logic in the reference low power RTL netlist,
   creating level shifter logic in the reference low power RTL netlist, and
   creating state retention logic in the reference low power RTL netlist; and
   performing equivalence checking using a method implemented on the computer system, between the gate netlist and the reference low power RTL netlist.

2. The method of claim 1, wherein annotating the low power requirements described in the power specification file into the reference low power RTL netlist comprises:
   defining isolation cells in the RTL netlist;
   defining level shifter cells in the RTL netlist;
   defining state retention cells in the RTL netlist;
   identifying power logic in the RTL netlist; and
   creating power domains in the RTL netlist.

3. The method of claim 2, wherein creating power domains comprises:
   specifying power domain instances of the circuit; and
   annotating boundary ports between the power domain instances.

4. The method of claim 1, wherein creating isolation logic comprises:
   identifying net pairs that cross power domains;
   generating control logic for controlling isolation conditions;
   integrating the control logic to a power manager;
   determining insertion locations in accordance with the net pairs; and
   inserting isolation cells at corresponding insertion locations using a set of predefined isolation cells.

5. The method of claim 1, wherein creating level shifter logic comprises:
  identifying net pairs that cross power domains;
  determining insertion locations in accordance with the net pairs; and
  inserting level shifter cells at corresponding insertion locations using a set of predefined level shifter cells.

6. The method of claim 1, wherein creating state retention logic comprises:
  identifying data storage element instances in a power domain;
  replacing the data storage element instances with state retention cells;
  generating a first control logic for controlling the state retention cells;
  integrating the first control logic to a power manager;
  generating a second control logic for controlling clock gating; and
  integrating the second control logic with the state retention cells and the power manager.

7. The method of claim 1, wherein the RTL netlist comprises:
  a legacy design of the circuit, wherein the legacy design does not contain description of low power design components.

8. A computer program product for conducting equivalence checking of a circuit, comprising a medium storing programs for execution by one or more computer systems, the computer program product comprising:
  code for receiving a register-transfer level (RTL) netlist representation of a circuit;
  code for receiving a power specification file for describing low power requirements of the circuit including,
  defining isolation cells,
  defining level shifter cells,
  defining state retention cells,
  identifying power logic, and
  creating power domains;
  code for creating a gate netlist using the RTL netlist and the power specification file, wherein the gate netlist represents a design implementation of the circuit;
  code for creating a reference low power RTL netlist using the RTL netlist and the power specification file, wherein the reference low power RTL netlist represents a design specification of the circuit;
  wherein the code for creating a reference low power RTL netlist includes code for annotating the low power requirements described in the power specification file into the reference low power RTL netlist;
  wherein the code for creating a reference low power RTL netlist further includes,
  code for creating isolation logic in the reference low power RTL netlist,
  code for creating level shifter logic in the reference low power RTL netlist, and
  code for creating state retention logic in the reference low power RTL netlist; and
  code for performing equivalence checking between the gate netlist and the reference low power RTL netlist.

9. The computer program product of claim 8, wherein the code for annotating the low power requirements described in the power specification file into the reference low power RTL netlist comprises:
  code for defining isolation cells in the RTL netlist;
  code for defining level shifter cells in the RTL netlist;
  code for defining state retention cells in the RTL netlist;
  code for identifying power logic in the RTL netlist; and
  code for creating power domains in the RTL netlist.

10. The computer program product of claim 9, wherein the code for creating power domains comprises:
  code for specifying power domain instances of the circuit; and
  code for annotating boundary ports between the power domain instances.

11. The computer program product of claim 7, wherein the code for creating isolation logic comprises:
  code for identifying net pairs that cross power domains;
  code for generating control logic for controlling isolation conditions;
  code for integrating the control logic to a power manager;
  code for determining insertion locations in accordance with the net pairs; and
  code for inserting isolation cells at corresponding insertion locations using a set of predefined isolation cells.

12. The computer program product of claim 7, wherein the code for creating level shifter logic comprises:
  code for identifying net pairs that cross power domains;
  code for determining insertion locations in accordance with the net pairs; and
  code for inserting level shifter cells at corresponding insertion locations using a set of predefined level shifter cells.

13. The computer program product of claim 7, wherein the code for creating state retention logic comprises:
  code for identifying data storage element instances in a power domain;
  code for replacing the data storage element instances with state retention cells;
  code for generating a first control logic for controlling the state retention cells;
  code for integrating the first control logic to a power manager;
  code for generating a second control logic for controlling clock gating; and
  code for integrating the second control logic with the state retention cells and the power manager.

14. The computer program product of claim 8, wherein the RTL netlist comprises:
  a legacy design of the circuit, wherein the legacy design does not contain description of low power design components.

15. A system for conducting equivalence checking of a circuit, comprising:
  at least one processing unit for executing computer programs;
  a graphical-user-interface for viewing representations of the circuit on a display;
  a memory for storing information of the circuit;
  logic for receiving a register-transfer level (RTL) netlist representation of the circuit;
  logic for receiving a power specification file for describing low power requirements of the circuit including,
  logic for defining isolation cells,
  logic for defining level shifter cells,
  logic for defining state retention cells,
  logic for identifying power logic, and
  logic for creating power domains;
  logic for creating a gate netlist using the RTL netlist and the power specification file, wherein the gate netlist represents a design implementation of the circuit;
  logic for creating a reference low power RTL netlist using the RTL netlist and the power specification file, wherein the reference low power RTL netlist represents a design specification of the circuit; wherein creating a reference low power RTL netlist includes logic for annotating the low power requirements described in the power specification file into the reference low power RTL netlist;

wherein logic for creating a reference low power RTL netlist further includes, logic for creating isolation logic in the reference low power RTL netlist, logic for creating level shifter logic in the reference low power RTL netlist, and logic for creating state retention logic in the reference low power RTL netlist; and logic for performing equivalence checking between the gate netlist and the reference low power RTL netlist.

16. The system of claim 15, wherein the logic for annotating the low power requirements described in the power specification file into the reference low power RTL netlist comprises:

logic for defining isolation cells in the RTL netlist;
logic for defining level shifter cells in the RTL netlist;
logic for defining state retention cells in the RTL netlist;
logic for identifying power logic in the RTL netlist; and
logic for creating power domains in the RTL netlist.

17. The system of claim 16, wherein the logic for creating power domains comprises:

logic for specifying power domain instances of the circuit; and logic for annotating boundary ports between the power domain instances.

18. The system of claim 15, wherein the logic for creating isolation logic comprises:

logic for identifying net pairs that cross power domains;
logic for generating control logic for controlling isolation conditions;
logic for integrating the control logic to a power manager;
logic for determining insertion locations in accordance with the net pairs; and
logic for inserting isolation cells at corresponding insertion locations using a set of predefined isolation cells.

19. The system of claim 15, wherein the logic for creating level shifter logic comprises:

logic for identifying net pairs that cross power domains;
logic for determining insertion locations in accordance with the net pairs; and
logic for inserting level shifter cells at corresponding insertion locations using a set of predefined level shifter cells.

20. The system of claim 15, wherein the logic for creating state retention logic comprises:

logic for identifying data storage element instances in a power domain;
logic for replacing the data storage element instances with state retention cells;
logic for generating a first control logic for controlling the state retention cells;
logic for integrating the first control logic to a power manager;
logic for generating a second control logic for controlling clock gating; and
logic for integrating the second control logic with the state retention cells and the power manager.

* * * * *